INTERCONNECTION ARRANGEMENT FOR INTEGRATED CIRCUITS

Filed Dec. 23, 1964

INVENTORS
HAJIME SEKI
DONALD P. SERAPHIM

BY S. P. Tedesco
ATTORNEY

United States Patent Office 3,312,871

Patented Apr. 4, 1967

3,312,871

INTERCONNECTION ARRANGEMENT FOR INTEGRATED CIRCUITS

Hajime Seki, Yorktown Heights, and Donald P. Seraphim, Bedford Hills, N.Y., assignors to International Business Machines Corporation, Armonk, N.Y., a corporation of New York Filed Dec. 23, 1964, Ser. No. 420,580
9 Claims. (Cl. 317—101)

This invention relates to arrangements for functionally interconnecting active circuit elements on a planar semiconductor wafer into integrated circuits. By integrated circuit arrangment is meant that the semiconductor wafer forms an essential constituent of the active and/or passive elements and, in addition, provides structural support therefor.

With the development of large and complex electronic equipments and the attendant high cost of manufacturing the same, effort is being expended by industry to batch-fabricate large numbers of active elements along with their functional interconnections onto a single semiconductor wafer. The objective of such effort is to reduce the physical size and objectionable high cost of these equipments and, in addition, to provide reliability and optimum power utilization from the system viewpoint.

The microminiature size of the active elements severely complicates the problem of providing functional interconnections therebetween and on the semiconductor wafer. By functional interconnections are meant the electrical conductors formed by either metallization or diffusion techniques, necessary to define an operative circuit arrangement of the active elements. It is contemplated that in excess of 1000 active elements will be functionally interconnected on a semiconductor wafer having a diameter of approximately one inch. While present day fabrication techniques have reduced somewhat the number of functional interconnections required, conventional interconnection techniques are impractical in view of the size-factor and require costly and complicated equipments.

Interconnection techniques to be practical must exhibit high degrees of reliability and flexibility to prevent manufacturing costs from rising to prohibitive proportions. A high degree of flexibility is required since integrated arrangements, while performing a same system function, can require different interconnection patterns due to the presence of imperfect active elements on the semiconductor wafer; accordingly, the rate of rejection of semiconductor wafers is substantially reduced. To utilize only semiconductor wafers whereon all active elements conform to specifications, i.e., 100 percent reproducibility, would make the cost of these equipments prohibitive. Flexibility allows a given array of active devices to be functionally interconnected to perform any of a variety of system functions to provide manufacturing freedom. Also, space requirements of such interconnection arrangements must be minimal since physical size is of primary importance. It is anticipated that large scale functional interconnecting of active devices may approximate 70 percent of the available surface area of the semiconductor wafer. Accordingly, if space requirements are reduced, a large number of active elements can be formed on a semiconductor wafer of given size or, conversely, a given number of such elements can be formed on a semiconductor wafer of smaller dimensions. In either event, the objectives of industry will be obtained.

Accordingly, an object of this invention is to provide a highly flexible interconnection arrangement for integrated circuits having minimal space requirements.

Another object of this invention is to provide an interconnection arrangement for integrated circuits compatible with the fabrication of the constituent active elements.

Functional interconnections in integrated circuit arrangements are generally formed by metallization processes. When metallization processes are employed, electrical conductors are defined by thin metallic patterns insulated from the semiconductor wafer by a thin dielectric film; when diffusion processes are employed, electrical conductors are defined by degenerately-doped patterns of opposite conductivity type, the resulting "p-n" junction defined with the semiconductor wafer providing necessary insulation. Since similar processes are employed to fabricate active elements, steps in the fabrication of functional interconnections and active elements which are compatible can be effected with the same equipments and materials. Also, similar processes are employed to fabricate the interconnection arrangements of this invention; however, interconnection arrangements of this invention are distinguishable in the reduced number of process steps required for fabrication and, also, due to their high flexibility and minimal space requirements whereby more compact integrated arrangements are achieved at substantial savings in cost.

In accordance with a preferred embodiment of this invention, active elements are formed in a coordinate array on the semiconductor wafer, and a plurality of first-level conductors, either metallized or diffused, is formed in spaced-parallel relationship between adjacent columns of such array; in addition, a second plurality of first-level conductors is formed in spaced-parallel relationship between corresponding active elements in adjacent rows of such array. Selected ones of the first plurality and each of the second plurality of first-level conductors are preferably aligned, but unconnected, with opposing terminals of adjacent active elements in the array. In accordance with a particular feature of this invention, selected first-level conductors are formed in discontinuous fashion, or segmented, whereby the opposing terminals of adjacent active devices can be independently connected to satisfy design requirements. A thin dielectric film is formed over the first-level conductors and defines a coordinate hole pattern providing access to selected portions of each first-level conductor. In accordance with particular aspects of this invention, maximum flexibility is achieved by depositing selected patterns of second-level metallized conductors over the thin dielectric film to electrically connect selected first-level conductors and, also, selected terminals of the active elements and aligned first-level conductors. Thus, the functional interconnection of the active devices is determined solely by the patterns of the second-level conductors, such pattern being readily changeable to provide a desired system function. Only second-level conductors required to effect the functional interconnection of the active elements need be deposited. In prior art structures, flexibility in large scale functional interconnection of active elements is a three-dimensional proposition, requiring numerous cross-overs. In the interconnection arrangement of this invention, however, flexibility is reduced to a one-dimensional proposition since operative interconnection of the circuit elements is determined by the pattern of second-level conductors.

Compactness along with flexibility is achieved by forming at least a pair of second-level conductors between adjacent columns of the hole pattern in the thin dielectric layer; since a second-level conductor need extend only between connected first-level conductors, a number of second-level conductors can be aligned between such adjacent columns. Connection between a second-level conductor and any two or more first-level conductors is made by orthogonal extensions passing through holes in the thin dielectric layer. With respect to adjacent second-level conductors formed between adjacent columns of holes, such extensions are oppositely directed. This feature is significant in reducing the space requirements of the interconnection arrangements of this invention while maintaining flexibility. For example, the space requirements of the interconnection arrangements of this invention having ten second-level conductors is reduced by a factor approximately 25 percent over prior art arrangements having a same capacity.

The foregoing and other objects, features, and advantages of the invention will be apparent from the following more particular description of preferred embodiments of the invention, as illustrated in the accompanying drawings.

Figures 1A, 1B, 2A, 2B:
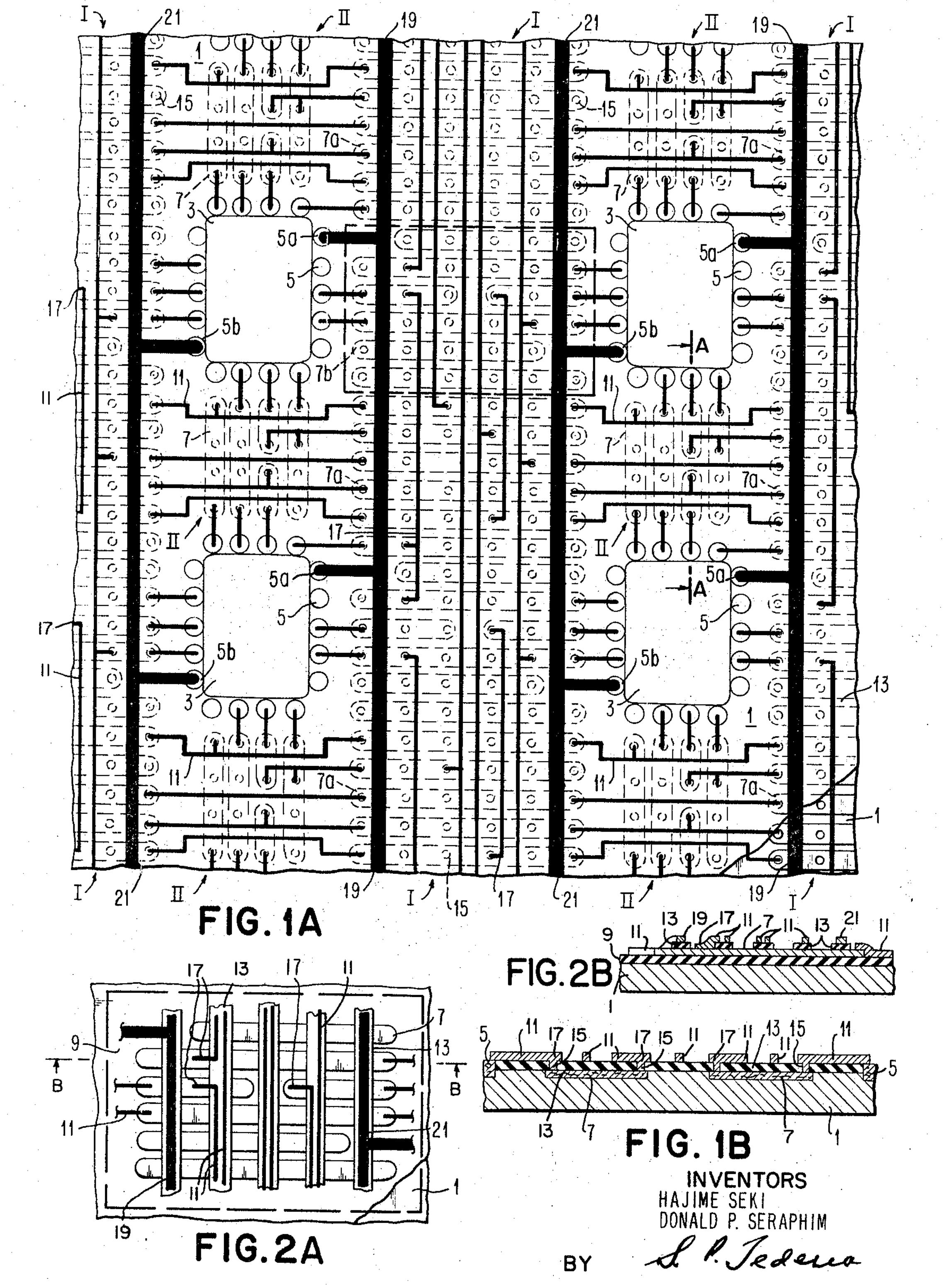
FIG. 1A is a top view of one embodiment of this invention for functionally interconnecting a plurality of active devices formed on a semiconductor wafer.
FIG. 1B is a sectional-view taken along the line A—A of FIG. 1A.
FIG. 2A is a top view of an additional embodiment of this invention.
FIG. 2B is a sectional view taken along line B—B of FIG. 2A.

In the description, the same characters are employed to identify corresponding structures in each of the drawings. Referring to FIG. 1A, a plurality of active devices 3 are formed in a coordinate array on a p-type semiconductor wafer 1. Each active device 3 may comprise either a single active element, e.g., a bipolar transistor, field effect transistor, etc.; a passive circuit element, e.g., a thin film or diffused resistor, etc.; or an operative circuit arrangement of such elements. Each active device 3 is provided a number of terminals 5 defined by degenerately-doped diffusions or metal lands.

An interconnection arrangement of this invention comprises a plurality of first-level conductors 7, either degenerately-doped regions as shown in FIGS. 1A and 1B or thin metallic films as hereinafter described in regard to FIGS. 2A and 2B, and a plurality of second-level conductors 11 formed as thin metallic films and insulated by a genetically grown oxide layer or a deposited second dielectric layer 13 from the first-level conductors. In FIG. 1A, first-level conductors 7 are formed by conventional diffusion processes in spaced-parallel fashion between adjacent columns of active devices 3 to define major interconnection arrangements I, and, also, between opposing active devices 3 in adjacent rows to define minor interconnection arrangements II. First-level conductors 7 in both major and minor interconnection arrangements I and II are formed concurrently and provide "crossuder connections" in the interconnection pattern. First-level conductors 7 are aligned with opposing terminals 5 of adjacent active dveices 3. In addition, particular first-level conductors **7*a*** in major interconnection arrangements I are aligned as "crossunder connections" between horizontally-spaced minor interconnection arrangements II.

Also, second-level conductors 11 of major and minor interconnection arrangements I and II are formed concurrently and serve to functionally inetrconnect terminals 5 of active devices 3 to aligned first-level conductors 7. Second-level conductors 11 are electrically integral with selected first-level conductors 7 through etched openings 15 in dielectric layer 13. Second-level conductors 11 can be formed by standard metallization processes, i.e., by vapor deposition or sputtering, in conjunction with photolythographic processes. As illustrated, particular first-level conductors 7 may be segmented when it is known a priori from the circuit design that aligned terminals 5 are not to be interconnected. Also, selected first-level conductors **7*b* may be shortened when a functional interconnection is not to be provided to a terminal of an active device 3. Accordingly, it is within the contemplation of this invention that first-level conductors may be of unequal length or segmented, as dictated by the interconnection pattern to be formed between active devices 3**.

Electrical insulation between first and second-level conductors 7 and 11 is effected by thin dielectric layer 13, e.g., of silicon dioxide ($SiO_2$). As illustrated, a coordinate arrangement of openings 15 is etched in dielectric layer 13, the spacing between adjacent files of holes being sufficient to allow deposition of at least a pair of second-level conductors 11 therebetween. As illustrated in FIG. 1, any number of distinct second-level conductors 11 can be formed and aligned between adjacent files of openings 15 in dielectric layer 13, each making contact to selected first-level conductors along orthogonal extensions 17. It is evident that the spacing between adjacent files of holes 15 may be increased to accommodate any number of additional second-level conductors 11 if such are bracketed by other conductors 11 and interconnect intermediate first-level conductors 7. In addition, operational voltages to active devices 3, i.e., power and ground leads 19 and 21, respectively, can be formed by wider metallic patterns. For example, power conductors 19 are multipled along extensions 17 to terminals **5*a* of each active device 3; also, ground conductors 21 are multipled to terminals 5*b* of each circuit device 3. First-level conductors 7 aligned with terminals 5*a* and 5*b* of active devices 3** are shortened since they are not required for functional interconnections.

The interconnection pattern of FIG. 1 is provided for illustrative purposes only and the fabrication process will be described assuming that active devices 3 have been formed by conventional processes. Obviously, process steps as hereinafter described, compatible with the fabrication of active devices 3, may be concurrently effected. A thin dielectric layer 13 (silicon dioxide) is thermally grown over p-type semiconductor wafer 1 and employed as a mask during the diffusion of first-level conductors 7. For example, if diffusion processes are to be effected, semiconductor wafer 1 is initially exposed at temperatures between 950° C. and 1150° C. to an atmosphere of either oxygen ($O_2$), water vapor ($H_2O$), oxygen and water vapor ($O_2+H_2O$), or carbon dioxide ($CO_2$) for a time sufficient to genetically form a dielectric layer between 5,000 A. and 10,000 A. When formed, openings corresponding to a desired pattern of first-level conductors 7 are etched in the dielectric layer 13 by conventional photoresist techniques, for example, as described in Principles of Solid-State Microelectronics, by S. N. Levine, published by Holt, Rinehart and Winston, 1963. A typical process includes the application of a thin layer of photoresist material over dielectric layer 13. The photoresist material is optically exposed through a photographic mask plate corresponding to the pattern of first-level conductors 7 and developed, i.e., unexposed portions are washed away by suitable solvent. Remaining resist material is cured at an elevated temperature. A suitable etchant, e.g., hydrofluoric acid (HF), is applied over the photoresist material and exposed portions of dielectric layer 13 whereby diffusion "windows" corresponding to the pattern of first-level conductors 7 are etched in the latter.

Exposed photoresist material is removed by an appropriate solvent, e.g., hot chromic acid or sulfuric acid. Semiconductor wafer 1 with the dielectric "diffusion mask" layer 13 is exposed, for example, to gaseous phosphorus pentoxide ($P_2O_5$) at an elevated temperature in the range of 1050° C. to form degenerately-doped diffusion patterns defining the individual first-level conductors 7. Subsequently, the dielectric "diffusion mask" layer 13 is washed in high purity water and wafer 1 is subjected to a reoxidation process to form continuous thin dielectric layer 13 over first-level conductors 7.

Alternatively, metallization processes can be employed to form the first-level conductors 7 (cf., FIG. 2). In such processes, thin dielectric layer 9 is genetically formed, as hereinabove described, and a continuous thin metallic film, e.g., of aluminum (Al), etc., is vapor deposited over regions of wafer 1 whereon major and minor interconnection arrangements I and II are to be located.

Dielectric layer 9 provides electrical insulation between first-level metallic conductors 7 and wafer 1. A layer of photoresist material is formed over the thin conductive film and exposed to a negative light pattern, as hereinabove described. The layer of photoresist material is developed and cured, exposed portions thereof being resistant to an appropriate etchant, e.g., sodium hydroxide (NaOH), reactive with the underlying metallic film. Treatment by the etchant removes exposed portions of the underlying thin conductive film and defines the desired pattern of first-level metallic conductors 7 by the remaining portions of the underlying thin conductive film. The exposed photoresist material is removed and a thin dielectric layer 13 is next formed either by vapor deposition, pyrolytic deposition, or sputtering processes over the first-level metallic conductors 7 which corresponds to the reoxidation product, as hereinabove described.

The next step in the process provides electrical access to first-level conductors 7. Numerous arrangements are available. For example, in one arrangement a coordinate array of openings 15 as shown in FIG. 1A is etched in dielectric layer 13, a number of such openings being located over each first-level conductor 7. An alternate arrangement provides that only openings 15 required for the desired functional interconnection of active devices 3 are etched in dielectric layer 9. A third arrangement, particularly illustrated in FIG. 2, provides for the deposition of a plurality of thin dielectric strips 13 in spaced-parallel fashion and transverse to the first-level conductor 7 in major and minor interconnection arrangements I and II, access to the first-level conductors being had between adjacent strips.

The described first and second arrangements can be formed by conventional photoresist techniques. For example, a layer of positive photoresist material is deposited over dielectric layer 9 and exposed through a photographic mask plate in the desired pattern. Also, when positive photoresist material is employed, a circular light pattern can be programmed to expose the surface portions where holes 15 are required; the position of holes 15 is determined by the design placement of second-level conductors 11. As seen from FIG. 1, a number of holes 15 are provided over each first-level conductor 7 and spaced to accommodate at least a pair of second-level conductors 11; also, holes 15 are provided over terminals 5 of active devices 3. Corresponding holes 15 over the first-level conductor 7 are arranged in files to facilitate deposition of the second-level conductors 11. When the photoresist material has been developed and cured, exposure to an appropriate etchant as hereinabove described, defines the desired pattern of holes 15. The remaining photoresist material is removed to expose the dielectric layer 13.

In FIGS. 2A and 2B, continuous dielectric strips 13 can be vapor deposited, portions of semiconductor wafer 1 being appropriately masked to effect deposition over portions of first-level conductors 7 whereon second-level conductors 11 are to be formed. It is evident that dielectric strips can be formed by photoresist techniques similar to those hereinabove described. Dielectric strips 13 serve a similar purpose as do the discrete files of holes 15 of FIG. 1A in providing access to first-level conductors 7.

The final step in the process is to fabricate second-level conductors 11 along with the power and ground leads 19 and 21, respectively, whereby the functional interconnection of active devices 3 is achieved. For example, a thin metallic film vapor deposited over thin dielectric layer 9 as in FIG. 1 or the pattern of dielectric strips 13 of FIG. 2, at least over regions defining major and minor interconnection arrangements I and II and terminals 5 of active devices 3. The thin metalic film is continuous with the first-level conductors 7 through holes 15 in dielectric layer 9 of FIG. 1 and, also, between dielectric strips 13 of FIG. 2. A thin layer of photoresist material is deposited over the thin metallic film and exposed in the desired pattern of second-level conductors 11 to be formed. For example, a circular light pattern or electron beam of appropriate diameter may be moved relative to the surface of wafer 1 and operated intermittently by conventional means to expose the photoresist material in the desired pattern. Such pattern should trace both the linear portion and orthogonal extensions 17 of the required second-level conductors 11 and, in addition, define second-level conductors interconnecting selected first-level conductors 7 and aligned terminals 5 of active devices 3. When the photoresist material is developed and cured, the exposed portions of the thin conductive film are etched, remaining portions defining the desired pattern of second-level conductors 11, as illustrated in FIGS. 1A and 2 functionally interconnecting active devices 3 to perform the desired system function. The exposed photoresist material is thereafter removed by a suitable solvent to complete the interconnection arrangement of this invention. If desired, a thick dielectric layer can be formed over the complete structure for potting purposes.

While the invention has been particularly shown and described with reference to preferred embodiments thereof, it will be understood by those skilled in the art that various changes in form and details may be made therein without departing from the spirit and scope of the invention.

What is claimed is:

1. An interconnection arrangement for interconnecting active circuit elements formed on a wafer comprising a first plurality of spaced-parallel conductors in a first plane and a second plurality of spaced-parallel conductors in a second plane and supported in insulated fashion on said wafer for interconnecting said active elements, said first and said second conductors being arranged in substantially transverse fashion and located between said active elements, selected ones of said first conductors being connected to said active elements, and insulating means positioned between said first and said second conductors and providing access to corresponding portions of said first conductors, adjacent ones of said second conductors each having at least one substantially orthogonal extension oppositely-directed with respect to said orthogonal extension of the other for effecting electrical contact to selected ones of said first conductors through said insulating means.

2. An interconnection arrangement as defined in claim 1 wherein particular ones of said second conductors include at least two substantially orthogonal extensions such that selected ones of said first conductors are electrically connected along said second conductors.

3. An interconnection arrangement as defined in claim 1 wherein said insulating means comprises a thin dielectric film defining a coordinate hole pattern providing access to corresponding selected portions of each of said first conductors, said adjacent second conductors being located between adjacent files of said holes whereby said oppositely-directed extensions pass through holes in said adjacent files.

4. An interconnection arrangement as defined in claim 1 wherein said insulating means comprises a plurality of spaced-parallel dielectric strips arranged between each of said first conductors and said adjacent ones of said second conductors, said oppositely-directed extensions making contact to said selected first conductors in the spacing between adjacent ones of said dielectric strips.

5. An arrangement for functionally interconnecting a plurality of active devices supported in coodinate fashion on a planar semiconductor member and each having a number of terminals comprising groups of spaced-parallel first conductors located between and aligned with corresponding to terminals of said active devices, groups of spaced-parallel second conductors arranged in substantially tranverse arrangement one with each group of said first conductors, said groups of first and second conductors being supported on said member in first and second planes, respectively, insulating means between said groups of first and second conductors and providing access to corresponding portions of said first conductors, selected ones of said first conductors being connected to said corresponding terminals, adjacent ones of said second conductors each including at least one substantially orthogonal member oppositely-directed with respect to said orthogonal member of the other for effecting electrical contact to selected first conductors through said insulating means, and means for interconnecting selected ones of said second conductors in different groups whereby connected terminals of said active devices are functionally interconnected along said first and said second conductors.

6. An arrangement as defined in claim 5 wherein said interconnecting means comprises a group of spaced-parallel third conductors and a group of spaced-parallel fourth conductors arranged in substantially tranverse fashion, said groups of third and fourth conductors being supported on said member in said first and second planes, respectively, between said transverse arrangements of first and second conductors, additional insulating means between said groups of third and fourth conductors and providing ac cess to coresponding portions of said third conductors, selected ones of said first and second conductors in different transverse arrangements being connected to said third and said fourth conductors, respectively, adjacent ones of said fourth conductors each including at least one substantially orthogonal member oppositely-directed with respect to said orthogonal member of the other for effecting electrical contact to selected third conductors through said additional insulating means.

7. An interconnection arrangement of active devices supported in coordinate fashion on a planar semiconductor member comprising a plurality of first conductors formed on said member in parallel spaced fashion, selected ones of said first conductors being connected to said active device, a thin dielectric layer formed over said first conductors and defining a coordinate hole pattern providing access to corresponding portions of each of said first conductors, and a plurality of parallel spaced second conductors formed in substantially transverse fashion over said first conductors and on said dielectric layer to locate said first and said second conductors in a first and second plane, respectively, at least two second conductors being positioned between adjacent files of holes in said pattern and each having at least one substantially orthogonal extension oppositely-directed with respect to said orthogonal extension of the other for effecting electrical contact to selected ones of said first conductors and passing through said holes in said adjacent files.

8. An interconnection arrangement for active devices formed on a planar semiconductor member comprising a number of active devices formed in coordinate fashion on said member and having a number of terminals to be interconnected, a number of first conductors formed in insulated fashion of said member and aligned with said terminals of each of said devices, selected ones of said first conductors being connected to said aligned terminals, a plurality of spaced-parallel dielectric strips formed in substantially transverse fashion over said first conductors, electrical access to said first conductors being had in the spacing between adjacent ones of said strips, and at least two metallic conductors formed over selected ones of said strips and at least one substantially orthogonal extension having oppositely-directed with respect to said orthogonal extension of the other for electrically interconnecting particular ones of said first-level conductors in the spacing between adjacent ones of said strips said first conductors and said metallic conductors being located in first and second planes, respectively.

9. An arrangement for interconnecting a plurality of active devices being formed in a coordinate array on a planar semiconductor member such that terminals of adjacent ones of said devices in said array are oppositely disposed, comprising a plurality of spaced-parallel first conductors formed on said member between adjacent columns of said array, said first conductors interpositioned between corresponding devices in said adjacent columns being substantially aligned with opposing terminals thereof, a plurality of spaced-parallel second conductors formed on said member between corresponding devices in adjacent rows of said array and substantially aligned with opposing terminals thereof, others of said first conductors are interpositioned between said adjacent pluralities of said second conductors, said first and said second conductors being located in a first plane, dielectric means formed over said first and second conductors and providing access to corresponding portions of said first and second conductors, and conductive means formed over said dielectric means and located in a second plane for functionally interconnecting selected terminals of said active devices along said first and second conductors, said conductive means comprising thin film conductors formed in spaced-parallel fashion on said dielectric means and arranged in transverse fashion with said pluralities of first and second conductors, adjacent ones of said third film conductors each having at least substantially orthogonal extension oppositely-directed with respect to said orthogonal extensions of the other for effecting electrical contact to selected ones of said first and second conductors through said dielectric means.

References Cited by the Examiner

UNITED STATES PATENTS

| | | | |
|---|---|---|---|
| 3,114,867 | 12/1963 | Szekely | 317—235 |
| 3,177,405 | 4/1965 | Gray | 317—101 |
| 3,199,002 | 8/1965 | Martin | 317—101 X |
| 3,201,850 | 8/1965 | Kahan | 29—155.55 X |

OTHER REFERENCES

IBM Technical Disclosure Bulletin, vol. 6, No. 4, September 1963, pp. 8 and 9.

ROBERT K. SCHAEFER, *Primary Examiner.*

D. SMITH, Jr., W. C. GARVERT, *Assistant Examiners.*